(12) United States Patent
Hsuan et al.

(10) Patent No.: US 6,214,630 B1
(45) Date of Patent: Apr. 10, 2001

(54) WAFER LEVEL INTEGRATED CIRCUIT STRUCTURE AND METHOD OF MANUFACTURING THE SAME

(75) Inventors: Min-Chih Hsuan, Hsinchu; Taisheng Feng, Taichung; Charlie Han, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/471,059

(22) Filed: Dec. 22, 1999

(51) Int. Cl.⁷ .......................... H01L 21/00; H01L 21/82; H01L 21/326; H01L 21/44; G01R 31/26
(52) U.S. Cl. ........................ 438/11; 438/14; 438/15; 438/18; 438/129; 438/132; 438/467; 438/601; 324/765
(58) Field of Search ........................... 438/129, 132, 438/467, 601, 11, 14, 15, 18, FOR 142; 324/765

(56) References Cited

U.S. PATENT DOCUMENTS 4,961,053 * 10/1990 Krug .
6,153,450 * 11/2000 Deguchi .

* cited by examiner

Primary Examiner—David E. Graybill
(74) Attorney, Agent, or Firm—Thomas, Kayden, Horstemeyer & Risley

(57) ABSTRACT

A wafer level IC structure and a method of manufacturing this wafer level IC structure are proposed, which can help increase the yield of the IC manufacture. The wafer level IC structure is constructed on a semiconductor wafer which is defined into a plurality of discrete IC blocks on the wafer, each IC block being used to form a plurality of IC components such as memory cells. A multi-layer interconnect structure is formed to electrically interconnect these IC components in each of the IC blocks. A first testing and repair process is then perform to disconnect any inoperative IC components from active use. This completes the fabrication stage of the manufacture process. In the subsequent packaging stage, a redistribution line structure is formed to interconnect the discrete IC blocks into an integral functional unit. A second testing and repair process is then perform to disconnect any inoperative IC blocks from active use. The overall IC manufacture would have an increased yield as compared to the prior art.

22 Claims, 6 Drawing Sheets

WAFER LEVEL INTEGRATED CIRCUIT STRUCTURE AND METHOD OF MANUFACTURING THE SAME

BACKGROUND OF THE INVENTION

1. Field of the Invention

This invention relates to integrated circuit (IC) manufacture technology, and more particularly, to a wafer level IC structure and a method of manufacturing this wafer level IC structure, which can help increase the yield of the IC manufacture.

2. Description of Related Art

In the semiconductor industry, IC design and fabrication is directed to high integration, high speed, high throughput, and low cost. In practice, however, 100% yield is nearly impossible, particularly for high-integration wafer level IC devices. The yield of IC manufacture is customarily defined in terms of density of defects, which can be minimized through good circuit design and the use of good repair technology. As an IC device is increased in layout size, it would also increase the probability of an increased number of defects; and therefore, the manufacture of wafer level IC devices is typically lower in yield than the manufacture of chip-sized IC devices. For wafer level memory devices, the nature yield is typically below 50%. Especially for wafer level DRAM devices, the nature yield is much lower.

A wafer level integration circuit allows a number of chips which are of different kinds to be mounted in a single wafer, which can provide an increased level of functionality and a reduced signal transmission path for higher performance. One drawback to the wafer level integration circuit, however, is that it is highly complex in structure, resulting in low yield and high manufacture cost, and is therefore only used in some special high-level products such as supercomputers.

One solution to increase yield in the manufacture of chip-sized memory devices is to provide a redundant circuit in each memory device so that each inoperative memory cell, if any, can be replaced by a backup one in the redundant circuit. One drawback to this solution, however, is that it is only suitable for use on chip-sized IC devices and unsuitable for use on wafer level integration circuit since it would be difficult to integrate a redundant circuit in a wafer level integration circuit. Meanwhile, this solution would increase the die size so that increases the manufacturing cost. Another solution is to use the so-called discretionary wiring method, by which only operative components, excluding inoperative ones, that are checked out during testing are wired. One drawback to this solution, however, is that various photomasks, and not a single one, might be required to perform the wiring for different IC devices since different IC devices may not have inoperative components at the same locations. This drawback makes the discretionary wiring method very costly to implement.

The U.S. Pat. No. 4,703,436 discloses a wafer level IC structure for SRAM (static random-access memory) which includes a plurality of discrete memory chips and is characterized in the use of a multi-layer interconnect structure for interconnecting these discrete memory chips. Moreover, this patented structure utilizes a plurality of fuses for selective disconnection of inoperative components from active use. One drawback to this patented structure, however, is that the provision of these fuses and the use of additional test pads during testing would undesirably increase the overall layout area of the IC device and the manufacturing cost, making the resulted IC device quite bulky. Moreover, this patented structure is only suitable for SRAM fabrication but unsuitable for DRAM fabrication.

The U.S. Pat. No. 5,072,424 proposes a wafer level IC structure for DRAM, which is characterized in the use of a serial looping chain structure to interconnect the memory cells and allow these memory cells to be tested through software means. Inoperative memory cells, if any, can be replaced by logic control means through EEPROM. One drawback to this patented structure, however, is that the required refreshing process would make the operation very complex. Moreover, the use of software means for access operation would considerably slow down the access speed to the DRAM.

The U.S. Pat. No. 5,576,554 discloses a wafer level IC structure which includes a plurality of IC modules and is characterized in the use of the blank areas among the IC modules to form a chessboard-like interconnect structure serving as a bi-directional bus. Further, this patented structure is formed with a plurality of fuses at the intersections of the chessboard-like interconnect structure for selective disconnection of inoperative components, if any, from active use. This patented structure, however, is still unsatisfactory to use.

SUMMARY OF THE INVENTION

It is an objective of this invention to provide a new wafer level IC structure and a method of manufacturing this wafer level IC structure, which allows the manufacture of wafer level IC devices to have an increased yield as compared to the prior art.

It is another objective of this invention to provide a new wafer level IC structure and a method of manufacturing this wafer level IC structure, which allows the manufacture process to be more cost-effective to implement than the prior art.

It is still another objective of this invention to provide a new wafer level IC structure and a method of manufacturing this wafer level IC structure, which allows the resulted IC device not to be increased in signal transmission distance so as to ensure high performance.

It is yet another objective of this invention to provide a new wafer level IC structure and a method of manufacturing this wafer level IC structure, which can help increase the packing density and number of I/O points as compared to the prior art.

It is still yet another objective of this invention to provide a new wafer level IC structure, which can provide two manufacturing processes for two kind products respectively: one is a normal single-die package IC; the other is a wafer level IC, according to the market demand.

In accordance with the foregoing and other objectives, the invention proposes a new wafer level IC structure and a method of manufacturing this wafer level IC structure.

The wafer level IC structure of the invention includes (a) a semiconductor wafer; (b) a plurality of discrete IC blocks defined on the wafer, each IC block including: (b1) a plurality of IC components and backup components; (b2) a multi-layer interconnect structure for electrically interconnecting the IC components in the associated IC block; (b3) a first set of bonding pads which are electrically connected to the multi-layer interconnect structure and serve as external connecting points for the IC components in the associated IC block; (b4) a first set of test pads which are electrically connected to the IC components and the multi-layer interconnect structure for use during testing; and (b5)

a first set of fuses which are electrically connected to the IC components and the multi-layer interconnect structure for use to selectively disconnect the associated IC components from active use if the associated IC components are determined to be inoperative during testing; (c) a redistribution line structure including a plurality of redistribution lines which are electrically connected to the first set of bonding pads of each of the IC blocks in a predefined manner so as to functionally combine the discrete IC blocks into an integral functional unit; (d) a second set of test pads which are electrically connected to the IC blocks and the redistribution line structure for use to apply test signals to the IC blocks during testing; and (e) a second set of fuses which are electrically connected to the redistribution line structure for use to selectively disconnect the associated IC blocks if the associated IC blocks are determined to be inoperative during testing.

In terms of method, the invention includes the following procedural steps: (Step 1) preparing a semiconductor wafer; (Step 2) defining a plurality of discrete IC blocks on the wafer; (Step 3) forming a plurality of IC components and backup components in each of the IC blocks; (Step 4) performing a first metallization process to form a multi-layer interconnect structure for electrically interconnecting the IC components in each of the IC blocks, with the multi-layer interconnect structure including a first set of bonding pads, a first set of test pads, and a first set of fuses, which are electrically connected to the IC components and the multi-layer interconnect structure in a predefined manner; (Step 5) performing a first testing process through the use of the first set of test pads to check whether the IC components, the backup components, and the multi-layer interconnect structure are operative or inoperative; (Step 6) performing a first repair process in which, or each inoperative IC component, if any, the associated one of the first set of fuses, is melted away to disconnect each inoperative IC component from active use; (Step 1) performing a second metallization process to form a redistribution line structure including a plurality of redistribution lines which are electrically connected to the first set of bonding pads of each of the IC blocks in a predefined manner so as to functionally combine the discrete IC blocks into an integral functional unit; a second set of test pads which are electrically connected to the IC blocks and the redistribution line structure; and a second set of fuses which are electrically connected to the redistribution line structure; (Step 8) performing a second testing process through the use of the second set of test pads to check whether all the IC blocks are operative or inoperative; and (Step 9) performing a second repair process in which, for each inoperative IC block, if any, the associated one of the second set of fuses, is melted away to disconnect each inoperative IC block from active use.

In the foregoing process, the initial steps for forming the discrete IC blocks and IC components are the same as the steps for forming a chip-sized IC device, and the first testing process and the first repair process can help increase the yield of the IC manufacture in this stage. In the subsequent packaging stage, the discrete IC blocks are then interconnected through a redistribution line structure to form an integral functional unit. The line width in this stage is from 2 μm to 5 μm. The second testing process and the second repair process can help increase the yield of the wafer level IC manufacture in this stage. Further, the redistribution line structure for interconnecting the IC blocks allows the resulted wafer level IC structure to have an increased yield since any inoperative blocks can be electrically excluded. Moreover, since it is unnecessary to modify the photomask pattern for the redistribution line structure throughout the manufacture process, he overall manufacture cost can be reduced as compared to the prior art. When the market demand of wafer level IC shrinks, the half-product after the initial steps for forming the discrete IC blocks and IC components is formed to discrete single-die packages alternatively. The selection of these two processes allows the manufacture process to be more flexible and cost-effective to implement than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
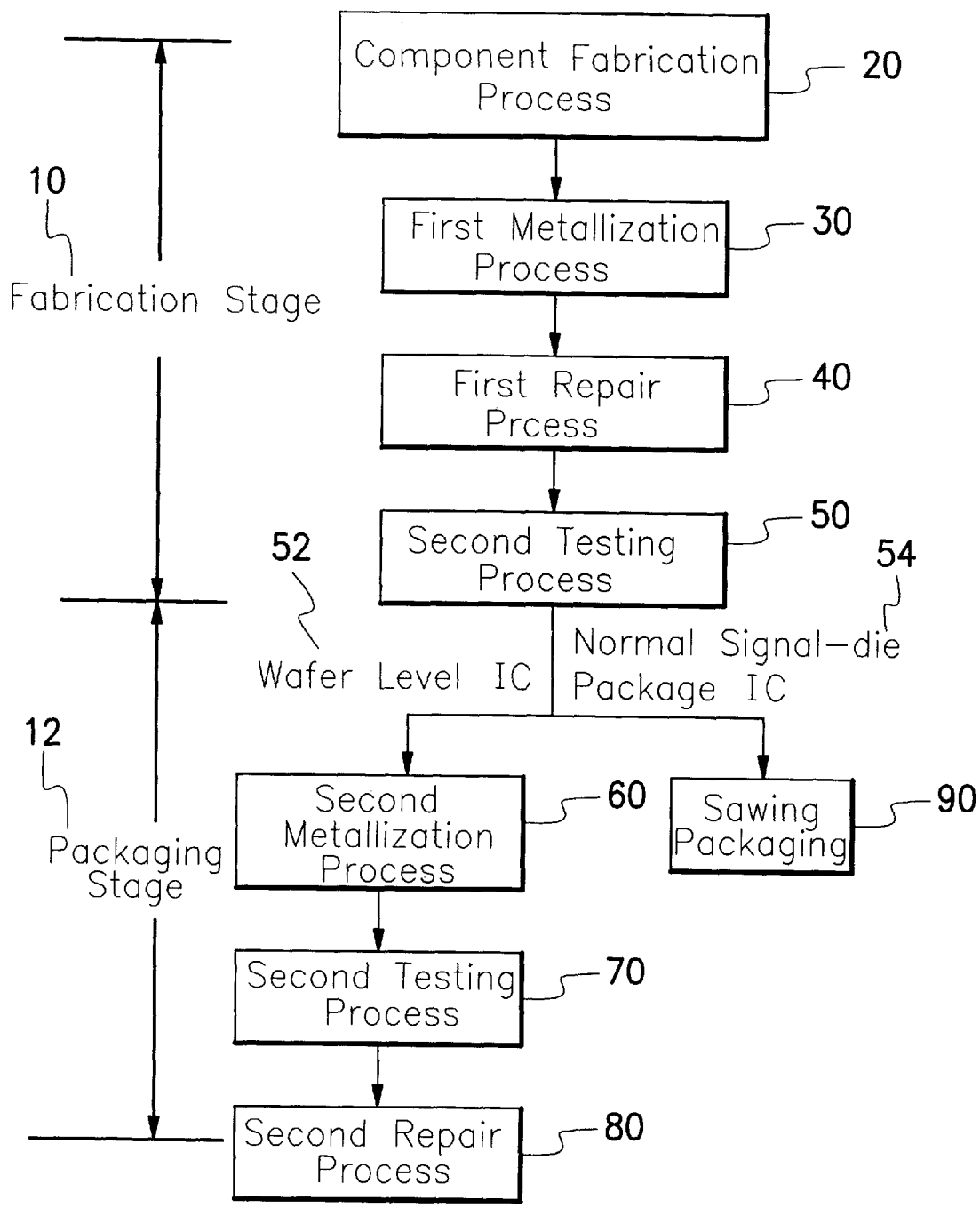
FIG. 1 is a flow diagram showing the procedural steps involved in the method for manufacturing the wafer level IC structure of the invention.

FIG. 1 is a flow diagram showing the procedural steps involved in the method for manufacturing the wafer level IC structure of the invention. The overall procedure includes two main stages: a fabrication stage 10 and a packaging stage 12. The IC structure formed in the wafer can be any semiconductor device, such as a memory device, a microprocessor, a microcontroller, or a digital signal processor. In the preferred embodiment, for example, the wafer level IC structure of the invention will be implemented as a memory device.

Figure 2:
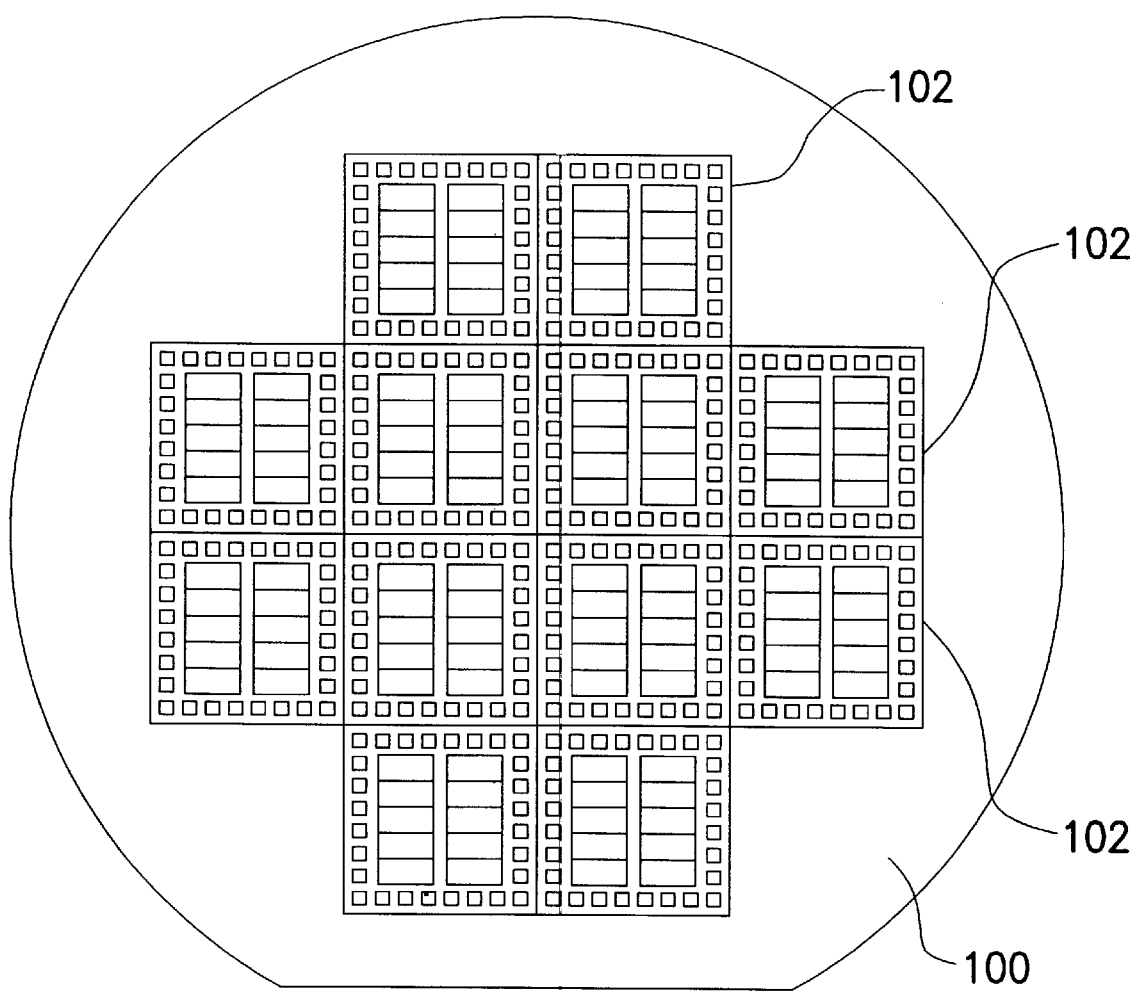
FIG. 2 is a schematic top view of the wafer level IC structure of the invention.
Figure 3:
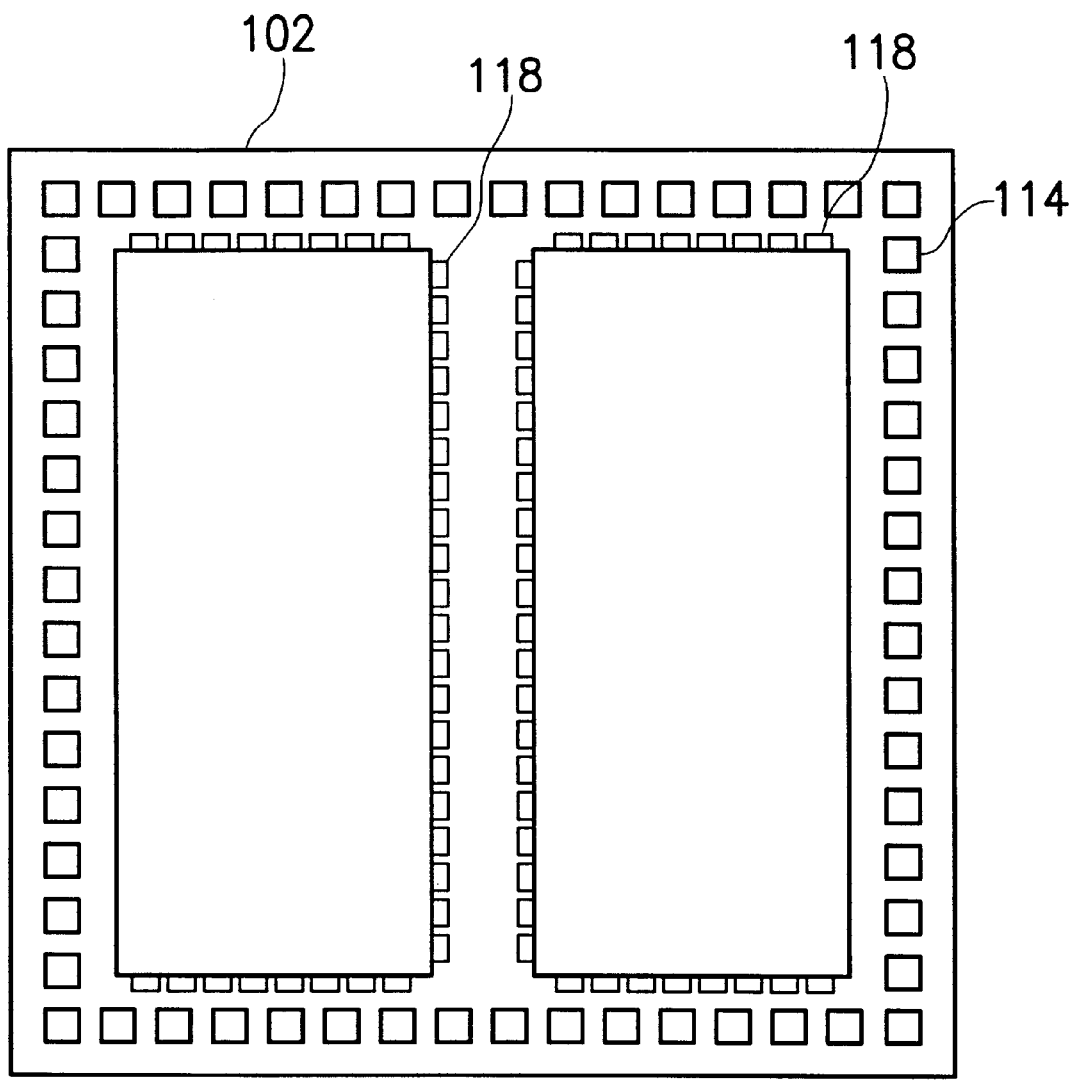
FIG. 3 shows an enlarged part of the wafer level IC structure of FIG. 2 where a single IC block is located.

FIG. 2 is a schematic top view of the wafer level IC structure of the invention; FIG. 3 shows an enlarged part of the wafer level IC structure of FIG. 2 where a single IC block is located; and FIG. 4 is a schematic sectional diagram of the part of the wafer level IC structure of the invention shown in FIG. 3.

Figure 4:
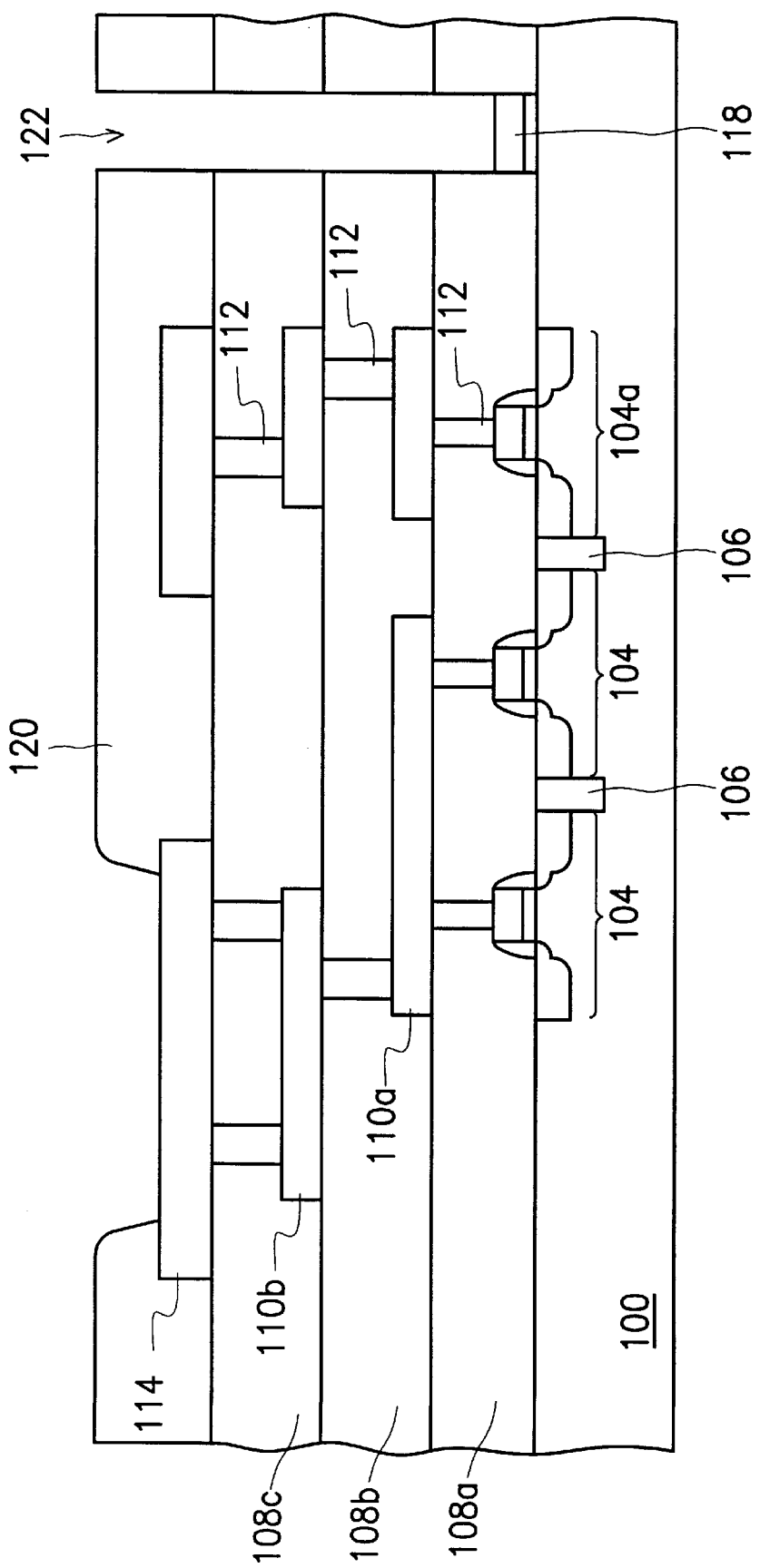
FIG. 4 is a schematic sectional diagram of the part of the wafer level IC structure of the invention shown in FIG. 3.

Referring to FIG. 1 together with FIGS. 2, 3, and 4, the first step 20 of the manufacture process is a component-fabrication process, in which a semiconductor wafer 100 is prepared and then a number of discrete IC blocks 102 are defined on the wafer 100, each block being used for the forming of a functional block, such as a memory block, part of a logic circuit, or part of a data processor. Further, each of the IC blocks 102 is formed with a plurality of bonding pads 114. Moreover, as shown in FIG. 4, each of the IC blocks 102 is formed with a plurality of IC components 104, including backup ones 1 104a, each of which is, for example, a MOS transistor with associated diodes, resistors, and capacitors to serve as one memory cell. These IC components 104 are isolated from each other by isolation structures 106.

The second step 30 is a first metallization process which is used to form a multilayer interconnect structure in each of the IC blocks 102 for the purpose of interconnect the IC components 104, 104a in each of the IC blocks 102. The multi-layer interconnect structure includes a plurality of stacked dielectric layers 108a, 108b, 108c and a plurality of metallization layers 110a, 110b and vias 112 among these dielectric layers 108a, 108b, 108c. These dielectric layers 108a, 108b, 108c are formed from a dielectric material, such as silicon oxide, silicon nitride, or an organic dielectric, through a CVD (Chemical-Vapor Deposition) or spin-coating process. The metallization layers 111a, 110b and the vias 112 are formed from an electrically-conductive material, such as polysilicon, aluminum, copper, or an aluminum alloy, through a sputtering process or a CVD process. A photolithographic and etching process is performed to define the locations of the metallization layers 110a, 110b and the vias 112. Further, a plurality of bonding pads 114 are formed on the top of the multi-layer interconnect structure to serve as external connecting points for the IC components 104. A passivation layer 120 is formed on the top of the wafer for protection of the entire wafer. The bonding pads 114 also serves as test pads for use in the testing of the IC components 104, 104a.

The IC components 104, 104a are further connected to a first set of fuses 118, which can be melt down to disconnect the associated IC components 104, 104a from active use if the associated IC components 104, 104a are inoperative. In the case of DRAM, for example, the first set of fuses 118 are connected to the word lines and bit lines of the IC components 104, 104a (which are memory cells in this case), and the first set of fuses 118 can be selectively melt down to allow the setting of predefined ON/OFF states to the DRAM circuitry. As shown in FIG. 4, the first set of fuses 118 are formed in the bottommost dielectric layer 108a, preferably from polysilicon. During the first metallization process, an opening 122 is also formed to expose each of the first set of fuses 118.

It is a characteristic aspect of the invention that the multi-layer interconnect structure formed in each of the IC blocks 102 is only intended for interconnecting the IC components 104, 104a within the associated IC block but not to those in the other IC locks. For this sake, the IC blocks 102 can be fabricated using the same photomask pattern; and therefore, manufacture cost can be reduced as compared to the prior art. The fabrication stage 10 is entirely carried out in an IC fabrication factory. The multi-layer interconnect structure has a line width of from 0.1 $\mu$m to 0.8 $\mu$m (micrometer), but the bonding pads 114 can be dimensioned within the range from 2 $\mu$m to 4 $\mu$m.

The third step 40 is a first testing process, in which the IC components 104 are tested through the use of the bonding pads 114 to check whether all the IC components 104, 104a are operative. Since the IC blocks 102 are separate units, they are tested in an independent manner.

Next, the fourth step 50 is a first repair process, in which each inoperative IC component found in the first testing process 40, if any, is disconnected from active use by using laser means to melt away the associated one of the first set of fuses 118. In the case of memory device, for example, the inoperative memory cell can be replaced by a backup one. This completes the fabrication stage 10. Roughly speaking, if the nature yield is between 10% and 20%, the first repair process 50 allows the yield at this point to be raised to between 70% and 85%.

Figure 5:
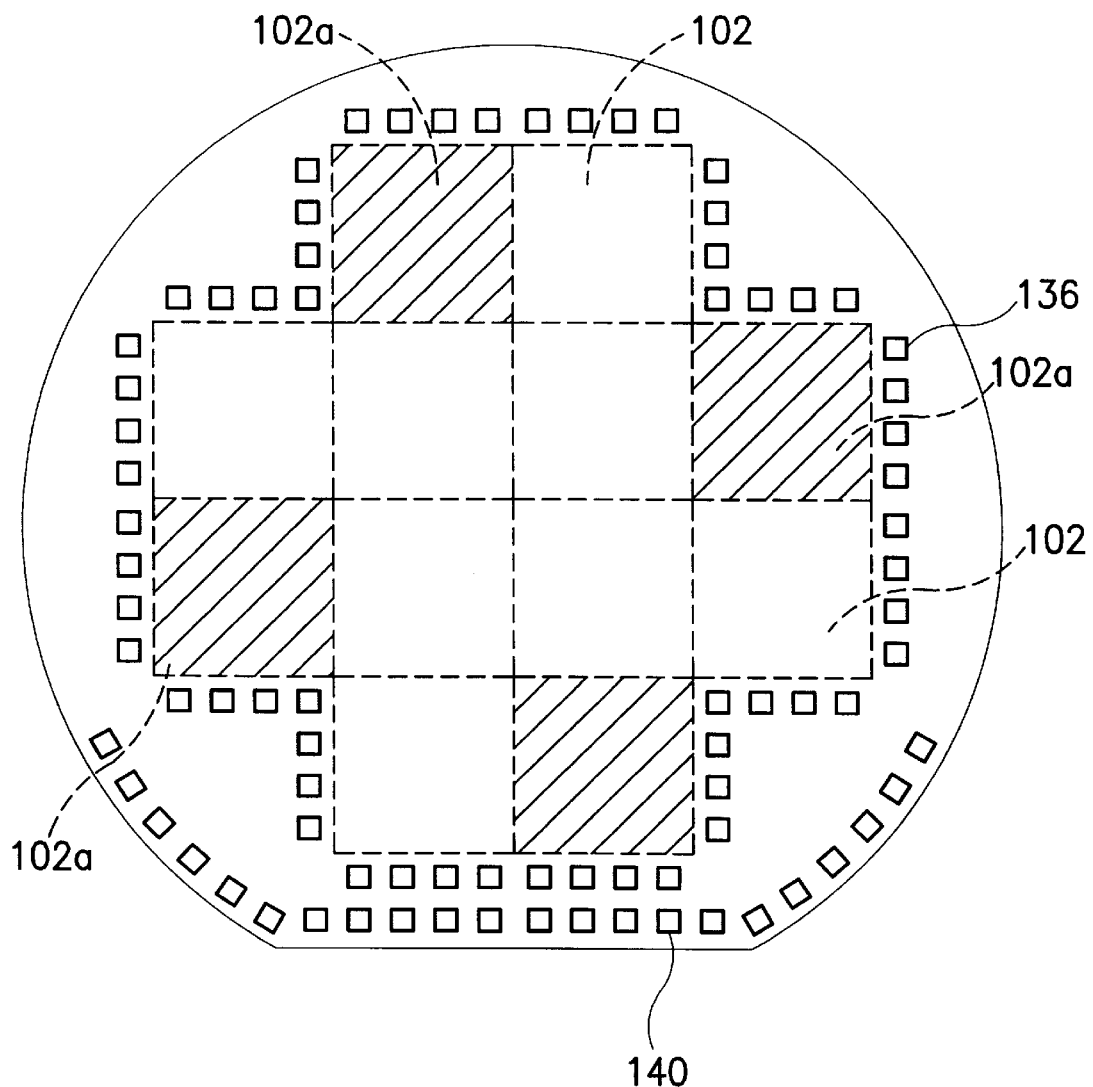
FIG. 5 is a schematic top view of the wafer level IC structure of the invention during the packaging process.
Figure 6:
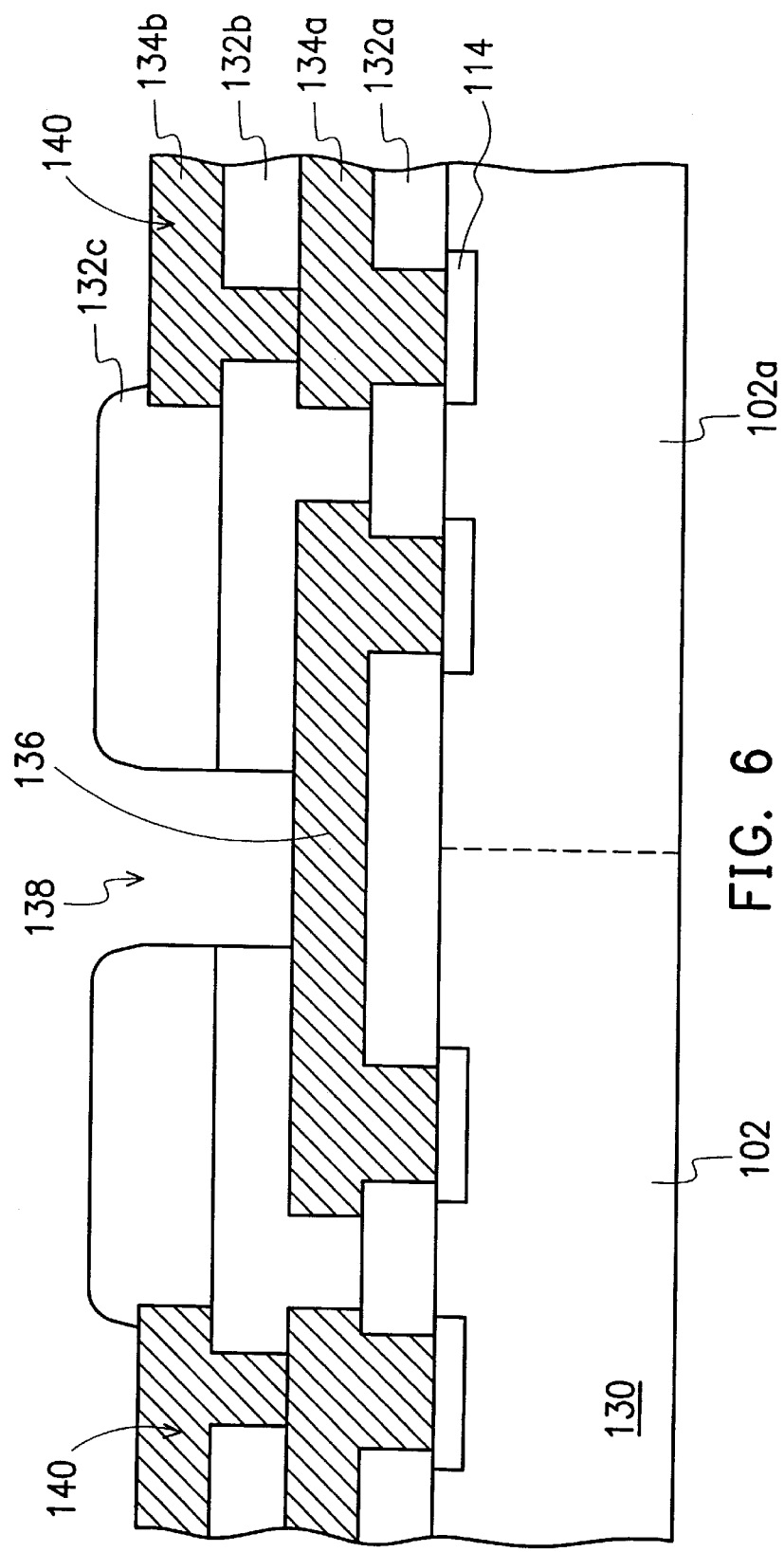
FIG. 6 is a schematic sectional diagram of the part of the wafer level IC structure of the invention shown in FIG. 5.

In subsequence to the fabrication stage 10, the packaging stage 12 is described in the following with reference to FIGS. 1, 5, and 6, where FIG. 5 is a schematic top view of the wafer level IC structure of the invention during the packaging process; and FIG. 6 is a schematic sectional diagram of the part of the wafer level IC structure of the invention shown in FIG. 5.

In the packaging stage 12, there are two selections for the packaging stage 12: (a) a single-die IC packaging process 54; (b) a wafer level IC process 52. For the single-die IC packaging process, the final test of the wafer is accomplished. Then, the wafer is sawed into singular chips. Each of the singular chips is packaged to formed a single-die IC. The initial step of the wafer level IC process is a second metallization process 60, which is performed to form a redistribution line structure for interconnecting the discrete IC blocks 102 into an integral functional unit. The redistribution line structure is also a multi-layer interconnect structure including a plurality of stacked dielectric layers 132a, 132b, 132c and metallization layers 134a, 134b, with the metallization layers 134a, 134b being electrically connected to the bonding pads 114 on the IC blocks 102. The dielectric layers 132a, 132b, 132c are formed from a dielectric material, preferably epoxy, through a coating process or a screen-printing process. The metallization layers 134a, 134b are formed from an electrically-conductive material, such as copper, through a plating process or an electroless plating process. The metallization layers 134a, 134b in combination serve as a set of redistribution lines which redistribute the original pattern of the bonding pads 114 into a new pattern of I/O points on the wafer. In the case of DRAM, for example, the redistribution line structure serves as a common bus which interconnects the separate memory blocks (i.e., the IC blocks 102) into a single, integral memory unit. Some IC blocks 102a serves as redundant blocks for repairing some defective IC blocks 102.

The top most metallization layer 134b is also shaped into a plurality of second bonding pads for external connections. Further, a second set of fuses 136 are formed and connected to the IC blocks 102 and the redistribution line structure (i.e., the metallization layers 134a, 134b). The second set of fuses 136 are preferably formed from metal rather than polysilicon. The packaging stage 12 is carried out in a packaging factory, with a line width from 2 $\mu$m to 5 $\mu$m (micrometer), and the yield can be nearly 100%.

The next step 70 is a second testing process, which is performed through the use of the second bonding pads and test pads on the topmost metallization layer 134b to check whether all the IC blocks 102, 102a and their associated redistribution lines are properly operative.

The next step 80 is a second repair process, in which each inoperative IC block, if any, is disconnected from active use by using laser means to melt away the associated one of the second set of fuses 136.

The subsequent steps to complete the packaging of the wafer level IC structure of the invention include the use of the BGA (Ball Grid Array) technology, the use of the DCA (Direct Chip Attach) technology, and the use of some specific connector for coupling the wafer to an external system. These technologies are all conventional and not within the scope and spirit of the invention, so description thereof will not be further detailed. In the above embodiment, the wafer level IC structure of the invention is used for the fabrication of a memory module. However, the invention is not limited to this application, and can be further either a microprocessor unit, a microcontroller unit, or a DSP (digital signal processor). Furthermore, the invention can be used for the fabrication of an IC unit including both memory and logic circuitry.

In conclusion, the invention has the following advantages over the prior art.

First, the invention would allow the manufacture to be more cost-effective than the prior art due to the provision of a plurality of discrete chip-sized IC blocks 102 during the fabrication stage 10, and these IC blocks 102 all require the same photomask pattern for fabrication. Moreover, the invention would allow a higher yield than the prior art due to the fact that these IC blocks 102 are non-interconnected during the fabrication stage 10, thus allowing the fabrication easy to carry out.

Second, the invention utilizes two repair processes, i.e., the first repair process 50 at the end of the fabrication stage 10 and the second repair process 80 at the end of the packaging stage 12, so that any inoperative components and IC blocks can be disconnected from active use and replaced with backup ones. This allows the yield of the IC manufacture to be increased as compared to the prior art.

Third, the use of the redistribution line structure for interconnecting the IC blocks 102 allows the resulted wafer level IC structure to have an increased yield since any inoperative blocks can be electrically excluded. Moreover, since it is unnecessary to modify the photomask pattern for the redistribution line structure throughout the manufacture process, the overall manufacture cost can be reduced as compared to the prior art Fourth, the second repair process 80 would not cause an increase in the signal transmission path in the wafer level IC structure as in the case of the prior art, so that the performance of the wafer level IC structure would not be degraded.

Fifth, in the case of the invention being implemented as a memory device, since the fabrication stage 10 is substantially the same as the prior art, the use of the invention would not cause an alteration to the cell density and the number of I/O nodes of the memory device.

Sixth, this invention provides a new wafer level IC structure, which can provide two manufacturing processes for two kind products respectively: one is a normal single-die package IC; the other is a wafer level IC, according to the market demand. The selection of these two processes allows the manufacture process to be more flexible and cost-effective to implement than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A wafer level IC structure, which comprises:
    a semiconductor wafer;
    a plurality of discrete IC blocks defined on the wafer, each IC block including:
        a plurality of IC components and backup components;
        a multi-layer interconnect structure for electrically interconnecting the IC components in the associated IC block;
        a first set of bonding pads which are electrically connected to the multilayer interconnect structure and serve as external connecting points for the IC components in the associated IC block and for use during testing;
        a first set of fuses which are electrically connected to the IC components and the multi-layer interconnect structure for use to selectively disconnect the associated IC components from active use if the associated IC components are determined to be inoperative during testing;
    a redistribution line structure including a plurality of redistribution lines which are electrically connected to the first set of bonding pads of each of the IC blocks in a predefined manner so as to functionally combine the discrete IC blocks into an integral functional unit;
    a second set of bonding pads which are electrically connected to the IC blocks and the redistribution line structure for use to apply test signals to the IC blocks during testing; and
    a second set of fuses which are electrically connected to the redistribution line structure for use to selectively disconnect the associated IC blocks if the associated IC blocks are determined to be inoperative during testing.

2. The wafer level IC structure of claim 1, wherein each IC block includes a memory device, a microprocessor, a microcontroller, or a digital signal processor.

3. The wafer level IC structure of claim 1, wherein the first set of fuses are made of polysilicon.

4. The wafer level IC structure of claim 1, wherein the second set of fuses are made of metal.

5. The wafer level IC structure of claim 1, wherein the redistribution line structure is formed with a line width of from 2 $\mu$m to 5 $\mu$m.

6. The wafer level IC structure of claim 1, further comprising:
    a second set of test pads which are electrically connected to the IC blocks and the redistribution line structure for use to apply test signals to the IC blocks during testing.

7. A method for manufacturing a wafer level IC structure, comprising the steps of:
    preparing a semiconductor wafer;
    defining a plurality of discrete IC blocks on the wafer;
    forming a plurality of IC components and backup components in each of the IC blocks;
    performing a first metallization process to form a multi-layer interconnect structure for electrically interconnecting the IC components in each of the IC blocks, with the multi-layer interconnect structure including a first set of bonding pads, and a first set of fuses, which are electrically connected to the IC components and the multi-layer interconnect structure in a predefined manner;
    performing a first testing process through the use of the first set of bonding pads to check whether the IC components, the backup components, and the multi-layer interconnect structure are operative or inoperative;
    performing a first repair process in which, for each inoperative IC component, if any, the associated one of the first set of fuses, is melted away to disconnect each inoperative IC component from active use;
    performing a second metallization process to form a redistribution line structure including a plurality of redistribution lines which are electrically connected to the first set of bonding pads of each of the IC blocks in a predefined manner so as to functionally combine the discrete IC blocks into an integral functional unit; and a second set of fuses which are electrically connected to the redistribution line structure;
    performing a second testing process through the use of the second set of bonding pads to check whether all the IC blocks are operative or inoperative; and performing a second repair process in which, for each inoperative IC block, if any, the associated one of the second set of fuses, is melted away to disconnect each inoperative IC block from active use.

8. The method of claim 7, wherein the multi-layer interconnect structure formed by the first metallization process includes: a plurality of first dielectric layers; a plurality of first metallization layers formed between the first dielectric layers; and a plurality of first vias penetrating the first dielectric layers to electrically connect one metallization layer to the other.

9. The method of claim 8, wherein the first dielectric layers are formed through a CVD process.

10. The method of claim 8, wherein the first dielectric layers are formed through a spin-coating process.

11. The method of claim 8, wherein the first metallization layers are formed through a CVD process.

12. The method of claim 8, wherein the first metallization layers are formed through a sputtering process.

13. The method of claim 7, wherein the multi-layer interconnect structure has a line width of less than 1 µm.

14. The method of claim 7, wherein the redistribution line structure formed by the second metallization process includes: a plurality of second dielectric layers; a plurality of second metallization layers formed between the second dielectric layers; and a plurality of second vias penetrating the second dielectric layers to electrically connect one metallization layer to the other.

15. The method of claim 14, wherein the second dielectric layers are formed through a spin-coating process.

16. The method of claim 14, wherein the second dielectric layers are formed through a printing process.

17. The method of claim 14, wherein the second metallization layers are formed through a plating process.

18. The method of claim 14, wherein the second metallization layers are formed through an electroless plating process.

19. The method of claim 7, wherein the redistribution line structure has a line width of from 2 µm to 5 µm.

20. The method of claim 7, wherein each IC block includes a memory device, a microprocessor, a microcontroller, or a digital signal processor.

21. The method of claim 7, wherein the first set of fuses are formed from polysilicon.

22. The method of claim 7, wherein the second set of fuses are formed from metal.

\* \* \* \* \*